United States Patent
Sato

(10) Patent No.: US 9,309,461 B2
(45) Date of Patent: Apr. 12, 2016

(54) PHOSPHOR DISPERSION LIQUID AND METHOD FOR MANUFACTURING LED DEVICE

(71) Applicant: Konica Minolta, Inc., Tokyo (JP)

(72) Inventor: Atsushi Sato, Tokyo (JP)

(73) Assignee: KONICA MINOLTA, INC., Tokyo (JP)

( * ) Notice: Subject to any disclaimer, the term of this patent is extended or adjusted under 35 U.S.C. 154(b) by 0 days.

(21) Appl. No.: 14/346,854

(22) PCT Filed: Sep. 25, 2012

(86) PCT No.: PCT/JP2012/006112
§ 371 (c)(1),
(2) Date: Mar. 24, 2014

(87) PCT Pub. No.: WO2013/046651
PCT Pub. Date: Apr. 4, 2013

(65) Prior Publication Data
US 2015/0232752 A1    Aug. 20, 2015

(30) Foreign Application Priority Data
Sep. 26, 2011   (JP) .................. 2011-209131

(51) Int. Cl.
*H01L 33/50*    (2010.01)
*C09K 11/77*    (2006.01)
*H01L 33/56*    (2010.01)
*H01L 33/58*    (2010.01)
*H01L 33/00*    (2010.01)
*C09K 11/02*    (2006.01)

(52) U.S. Cl.
CPC ........... *C09K 11/7774* (2013.01); *C09K 11/025* (2013.01); *H01L 33/0095* (2013.01); *H01L 33/504* (2013.01); *H01L 33/56* (2013.01); *H01L 33/58* (2013.01)

(58) Field of Classification Search
None
See application file for complete search history.

(56) References Cited

U.S. PATENT DOCUMENTS

2004/0104391 A1 * 6/2004 Maeda et al. ................... 257/79

FOREIGN PATENT DOCUMENTS

| CN | 1633718 A | 6/2005 |
|---|---|---|
| JP | 2003-115614 A | 4/2003 |
| JP | 2003-297240 A | 10/2003 |
| JP | 2004-000928 A | 1/2004 |
| JP | 2004-055632 A | 2/2004 |
| JP | 2004-153109 A | 5/2004 |
| JP | 2005-277441 A | 10/2005 |
| JP | 2008-205511 A | 9/2008 |

(Continued)

OTHER PUBLICATIONS

The Extended European Search Report dated Apr. 1, 2015 from the corresponding European Patent Application No. 12836066.6.

(Continued)

*Primary Examiner* — Cheung Lee
(74) *Attorney, Agent, or Firm* — Lucas & Mercanti, LLP

(57) ABSTRACT

The present invention provides a phosphor dispersion liquid in which phosphor particles, laminar clay mineral microparticles, and oxide microparticles are dispersed in a solvent, wherein when a glass bottle of a 15-mm inner diameter is filled with 5 ml of the phosphor dispersion liquid and left standing, the time taken for a supernatant layer to be generated due to settling of the phosphor particles is four hours or longer.

6 Claims, 2 Drawing Sheets

(56) References Cited

FOREIGN PATENT DOCUMENTS

| JP | 2010-016292 A | 1/2010 |
| JP | 2010-067862 A | 3/2010 |
| WO | 03/034508 | 4/2003 |
| WO | WO 2011/065321 A | 3/2011 |
| WO | WO 2011/102272 A | 8/2011 |

OTHER PUBLICATIONS

Office Action dated Apr. 28, 2015 from the corresponding Korean Patent Application No. 10-2014-7007486.
English translation of Office Action dated Apr. 28, 2015 from the corresponding Korean Patent Application No. 10-2014-7007486.
Office Action dated Apr. 7, 2015 from the corresponding Japanese Patent Application No. 2013-535904.
English translation of Office Action dated Apr. 7, 2015 from the corresponding Japanese Patent Application No. 2013-535904.
Office Action dated Dec. 2, 2015 corresponding Chinese Patent Application; Application No. 201280046815.2; Issuance number: 2015112800252910; Applicant: Konica Minolta, Inc.; Title of the Invention: Phosphor Dispersion Liquid and Method for Manufacturing LED Device; total of 7 pages.
English translation of Office Action corresponding Chinese Patent Application; total of 16 pages.
Office Action dated Dec. 24, 2015 corresponding Korean Patent Application; Application No. 10-2014-7007486; Applicant: Konica Minolta, Inc.; Representative: Soo-Gil Chang, et al.: Title of the Invention: Phosphor Dispersion Liquid and Method for Manufacturing LED Device; total of 3 pages.
English translation of Office Action corresponding Korean Patent Application; total of 4 pages.
Pre-Appeal Examination Report dated Feb. 2, 2016 corresponding Japanese Patent Application; Application No. 2013-535904; Appeal No. 2015-017769; Applicant: Konica Minolta, Inc.; total of 3 pages.
English translation of Pre-Appeal Examination Report corresponding Japanese Patent Application, total of 3 pages.

* cited by examiner

PHOSPHOR DISPERSION LIQUID AND METHOD FOR MANUFACTURING LED DEVICE

CROSS REFERENCE TO RELATED APPLICATION

This Application is a 371 of PCT/JP2012/006122 filed on Sep. 25, 2012 which, in turn, claimed the priority of Japanese Patent Application No. JP2011-209131 filed on Sep. 26, 2011 both applications are incorporated herein by reference.

TECHNICAL FIELD

The present invention relates to a phosphor dispersion liquid containing dispersed phosphor particles, and a method of manufacturing an LED device using the same.

BACKGROUND ART

Light-emitting devices using LED chips (LED devices) are finding wide applications because of increasing demand for light-emitting devices with higher luminance and lower energy consumption. Among other LED devices, white LED devices are particularly known that use a combination of a blue LED chip and a yellow phosphor that emits yellow light upon receipt of blue light allowing the blue light and the yellow light to be mixed so that white light is emitted from the device. The white LED devices are increasingly used as lighting sources such as electric lights, which require white light, and backlights for liquid crystal displays.

Other types of white LED devices that use a combination of an LED chip and phosphor have also been studied, including white LED devices that create white light by the combination of a LED chip that emits UV light and phosphors that emit, upon receipt of UV light, blue, green and red lights, and white LED devices that create white light by the combination of a LED chip that emits blue light and phosphors that emit red and green lights.

The white LED devices that use a combination of LED chip and phosphor can generate white light with a single LED chip and therefore can be more simplified as compared to white LED devices that use a combination of a plurality of LED chips of different colors for generation of white light. Moreover, for their low power consumption, the white LED devices have been advantageously used.

However, the light from white LED devices using a combination of LED chip and phosphor is undesirably colored when a balance between the emission light from the LED chip and fluorescence from the phosphor is disrupted. Coloring of light from the white LED device also causes "color non-uniformity," a phenomenon where color (chromaticity) varies depending on the observation angle of the device.

One cause of light coloring and color non-uniformity pertinent in the white LED device is the non-uniform distribution of phosphors in the LED device. The conventional manufacturing process of a white LED device involves applying on the LED chip a curable resin composition containing dispersed phosphor particles followed by curing, to form a phosphor layer around the LED chip. Phosphor, however, is generally an inorganic metal compound having an extremely high specific gravity; therefore, the phosphors in the curable resin composition settle down resulting in the phosphor particles to be more likely deposited on the LED chip in a non-uniform manner. As a consequence, light coloring and/or color non-uniformity occur in the white LED device.

Techniques such as those described below have been contemplated in an effort to reduce the occurrence of light coloring and/or color non-uniformity.

One disclosed technique for reduced color non-uniformity in the white LED device involves adding an anti-settling agent to a liquid encapsulating material containing phosphor particles thus preventing settling of the phosphor particles, which have high specific gravity (see PTL 1). Moreover, formation of a phosphor-containing encapsulating layer around the LED chip is followed by curing of the encapsulation layer while spinning the light-emitting device thus reducing the chromaticity difference, i.e., color non-uniformity in the light-emitting device (see PTL 1).

Another disclosed technique involves deposition of phosphor particles on the emission surface of the LED chip upon manufacture of a white LED device (see PTL 2). PTL 2 particularly claims that reduced conversion efficiency as well as chromaticity deviation among different directions and color non-uniformity due to failure to apply phosphor particles on the corners and lateral surfaces of the LED chip can be improved by spraying a spiral of atomized phosphor-containing coating solution.

CITATION LIST

Patent Literature

PTL 1
Japanese Patent Application Laid-Open No. 2004-153109
PTL 2
Japanese Patent Application Laid-Open No. 2003-115614

SUMMARY OF INVENTION

Technical Problem

The foregoing techniques can improve, to some extent, light coloring and color non-uniformity in one white LED device, i.e., chromaticity deviation among different light emission angles in one white LED device. Recently, however, white lighting apparatuses with multiple white LED devices have been developed and are increasingly used in automobile lighting systems, which require high luminance, as well as in store lighting systems where chromaticity is given high priority. In such lighting apparatuses, it is becoming more important that the chromaticity levels are exactly consistent among different white LED devices.

In particular, lighting from a white lighting apparatus that exhibits enhanced luminance by means of multiple white LED devices is recognized as having color non-uniformity when seen from a long distance, when there is a chromaticity difference among lights from the white LED devices. Accordingly, it is more important than ever to reduce the variation in chromaticity from one white LED device to another.

An applicator such as dispenser or sprayer is used to apply on a LED chip a liquid matter containing phosphor particles. Such applicators allow for continuous manufacturing of multiple white LED devices. Upon application using such an applicator, the phosphor-containing liquid matter stored in a coating solution tank is stirred with a stirring device provided in the tank, so that the phosphor particles in the liquid matter are uniformly dispersed. Subsequently, the phosphor-containing liquid matter being stirred in the tank is fed to the applicator head and applied through the nozzles to the LED chip. In the manner described above, a variation in luminescent color from one LED device to another is reduced.

Nevertheless, there remains a problem in the art that it takes longer time before the phosphors are fully dispersed, when the phosphor-containing liquid matter stored in a storage tank is charged into a coating solution tank and stirred. Moreover, since storage containers generally have no stirring device equipped, there are cases where some phosphor particles settle down and stick to the inner wall of the storage container. The sticking amount of phosphor varies depending on the storage time in the storage container thus resulting in slight changes in the phosphor amount in the liquid matter to be charged in the coating solution tank, depending on the storage time in the storage container. This hindered a sufficient reduction in the luminescence chromaticity variation in the resultant LED device.

The present invention thus provides a phosphor dispersion liquid containing phosphors as a dispersoid, wherein even after the dispersion liquid is allowed to stand, settling of the phosphors and their sticking to the inner wall of the storage container do not easily occur.

Solution to Problem

A first aspect of the present invention relates to phosphor dispersion liquids set forth below.

[1] A phosphor dispersion liquid including a dispersion solvent, phosphor particles, laminar clay mineral microparticles, and oxide microparticles, the phosphor particles, the laminar clay mineral microparticles, and the oxide microparticles being dispersed in the dispersion solvent, wherein when 5 ml of the phosphor dispersion liquid is charged into a glass bottle of 15 mm inner diameter and allowed to stand, the time it takes for a supernatant layer to be generated due to settling of the phosphor particles is 4 hours or longer.

[2] The phosphor dispersion liquid according to [1], wherein the phosphor dispersion liquid has a viscosity of 80 to 1,000 cp.

A second aspect of the present invention relates to methods of manufacturing an LED device set forth below.

[3] A method of manufacturing an LED device, including:
providing an LED chip package including a package and an LED chip disposed on the package, the LED chip having an emission surface; and
applying on the emission surface of the LED chip the phosphor dispersion liquid according to [1] to form a phosphor layer.

[4] The method according to [3], wherein the phosphor dispersion liquid is applied using a spray applicator,
the spray applicator including a coating solution tank for storing the phosphor dispersion liquid, a head having a nozzle for discharging the phosphor dispersion liquid, and a connector tube for allowing communication between the coating solution tank and the head.

[5] The method according to [3], further including applying on the emission surface of the LED chip a solution containing an organometallic compound.

[6] The method according to [3], wherein the LED device is a white LED device.

Advantageous Effects of Invention

In the phosphor dispersion liquid of the present invention, phosphors do not easily settle down; the time it takes for a supernatant layer to be generated due to settling of the phosphors is 4 hours or longer. Accordingly, when applying the phosphor dispersion liquid using an applicator, the time required for dispersing the phosphors before application is shortened, thus improving the efficiency with which the phosphor dispersion liquid is applied.

Further, long-term storage is made possible since the phosphors do not easily stick to the inner wall of a storage container even when the phosphor dispersion liquid is stored in the storage container for a long period of time.

DESCRIPTION OF EMBODIMENTS

1. Phosphor Dispersion Liquid

Figure 1:
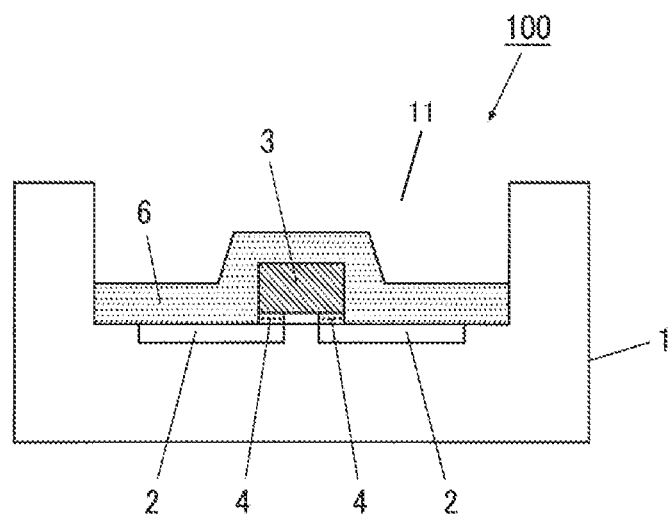
FIG. 1 is a schematic view of a cross-section of an LED device.

A phosphor dispersion liquid contains a dispersion solvent, phosphor particles, laminar clay mineral microparticles and oxide microparticles, all of which are dispersed in the dispersion solvent. The phosphor dispersion liquid may contain optional additional additives.

[Phosphor Particles]

Phosphor particles are excited at a wavelength of an emission light from an LED chip (excitation wavelength) and emit fluorescence having a wavelength different from the excitation wavelength. When an LED chip is used that emits blue light, a white LED device is obtained by employing phosphor particles that emit yellow fluorescence. Examples of phosphors that emit yellow fluorescence include YAG (yttrium-aluminum-garnet) phosphor. YAG phosphor can emit fluorescence of yellow light (550 to 650 nm wavelength) upon receipt of blue light (420 to 485 nm wavelength) emitted from the blue LED chip.

The phosphor may be produced for example by the method including: 1) mixing as flux an appropriate amount of fluoride such as ammonium fluoride with a mixed raw material having a predetermined composition followed by pressing to produce a molded article; and 2) loading the molded article into in a crucible followed by calcination in air at 1,350 to 1,450° C. for 2 to 5 hours to produce a sintered product.

The mixed raw material having a predetermined composition can be produced by fully mixing stoichiometric ratios of oxides of Y, Gd, Ce, Sm, Al, La and Ga or compounds that are easily converted to the oxides at elevated temperatures. Alternatively, the mixed raw material having a predetermined composition can be produced by mixing a coprecipitate oxide, aluminum oxide and gallium oxide, wherein the coprecipitate oxide is one produced by calcining a coprecipitate obtained using oxalic acid from a solution containing stoichiometric ratios of the rare earth elements Y, Gd, Ce and Sm in acid.

The phosphor is not limited to YAG phosphor; other phosphors, including Ce-free, non-garnet phosphor, can also be employed.

The mean particle diameter of the phosphor is preferably 1 to 50 μm. Luminescence efficiency (conversion efficiency) increases with increasing phosphor particle diameter. On the other hand, when the particle diameter of the phosphor is too large, the gaps in the phosphor layer that occur at the interfaces between the phosphor and binder become large enough to cause a reduction in the strength of the phosphor layer. The mean particle diameter of the phosphor can be measured for example by the Coulter counter method.

[Laminar Clay Mineral Microparticles]

The main component of the laminar clay mineral microparticles is a laminar silicate mineral, which is preferably a swelling clay mineral having mica structure, kaolinite structure, smectite structure or the like, more preferably a swelling clay mineral having clay material having smectite structure, a structure which exhibits good swelling property. In the phosphor dispersion liquid, the laminar clay mineral microparticles exist as card house structure and can significantly increase the viscosity of the phosphor dispersion liquid in small amounts. Moreover, the laminar clay mineral microparticles are of plate shape and therefore can improve the strength of the phosphor layer (see FIG. 1).

The amount of the laminar clay mineral microparticles in the phosphor dispersion liquid is preferably 0.1 to 5 wt %.

In view of their compatibility with the organic solvent in the phosphor dispersion liquid, the surface of the laminar clay mineral microparticles may be modified (surface-treated) with an ammonium salt or the like.

[Oxide Microparticles]

The oxide microparticles may be microparticles made of silicon oxide, titanium oxide, zinc oxide or the like. In particular, when the binder in the phosphor layer is a ceramic which is a cured product of a silicon-containing organic compound such as polysiloxane, it is preferable to employ silicon oxide microparticles from the perspective of stability with respect to the ceramic to be formed.

The amount of the oxide microparticles in the phosphor dispersion liquid is preferably 1 to 40 wt %.

The oxide microparticles may function as a filler that fill gaps generated at the interfaces between the phosphors and laminar clay mineral microparticles, as a thickener that increases the viscosity of the phosphor dispersion liquid, and/or as a film reinforcing agent that improves the strength of the phosphor layer.

The mean particle diameter of the oxide microparticles is preferably 0.001 to 50 μm in view of the respective effects described above. The mean particle diameter of the oxide microparticles can be measured for example by the Coulter counter method.

The surface of the oxide microparticles may be treated with a silane coupling agent or titanium coupling agent. Surface treatment increases the compatibility of the oxide microparticles with organometallic compounds and/or organic solvent.

[Dispersion Solvent]

The dispersion solvent of the phosphor dispersion liquid preferably contains an alcohol. The alcohol may be a monohydric alcohol such as methanol, ethanol, propanol or butanol or may be a polyol having more than one hydroxyl group. Two or more different types of alcohols may be combined. The use of alcohols having more than one hydroxyl group as the dispersion solvent allows for an easy increase in the viscosity of the phosphor dispersion liquid and thereby settling of the phosphor particles, a dispersoid, is easily prevented.

The boiling point of the dispersion solvent is preferably 250° C. or below. The reason for this is to facilitate drying of the solvent from the dispersion solution. When the boiling point is too high, evaporation of the dispersion solvent is slow, so that the phosphors present in the coating formed from the applied dispersion solution undesirably flow.

For the polyol having more than one hydroxyl group, any polyol can be used as long as it can be used as solvent. Examples of polyols usable in the present invention include ethylene glycol, propylene glycol, diethylene glycol, glycerol, 1,3-butanediol, and 1,4-butanediol, with ethylene glycol, propylene glycol, 1,3-butanediol, 1,4-butanediol and the like being preferable.

Part of the dispersion solvent in the phosphor dispersion liquid may be water. The presence of water in the phosphor dispersion liquid results in swelling of the laminar clay mineral microparticles due to entry of the water between layers of the laminar clay mineral microparticles and thus the viscosity of the phosphor dispersion liquid more easily increases. The water content in the dispersion solvent is preferably 5 wt % or more based on the total solvent amount. A water content of less than 5 wt % may result in failure to provide sufficient thickening effect. On the other hand, a water content of greater than 60 wt % easily results in a viscosity reduction rather than thickening effect due to excessive water. Thus, the water content is preferably 5 to 60 wt %, more preferably 7 to 55 wt %, based on the total solvent amount.

The viscosity of the phosphor dispersion liquid is typically 10 to 1,000 cp, preferably 80 to 1,000 cp, more preferably 200 to 450 cp. When the viscosity is low, the phosphor particles in the phosphor dispersion liquid easily settle down thus shortening the time it takes before a supernatant layer is generated. On the other hand, when the viscosity is too high, application of the phosphor dispersion liquid, particularly application with a sprayer, becomes difficult.

The phosphor dispersion liquid of the present invention is characterized in that phosphor particles, a dispersoid, do not easily settle down. More specifically, no supernatant layer is generated after 5 ml of the phosphor dispersion liquid of the present invention is charged into a glass bottle of 15 mm inner diameter and allowed to stand for 4 hours. The generation of a supernatant layer can be visually confirmed. The generation of a supernatant layer of 1 mm thickness or more may be defined as the generation of a supernatant layer.

[Production Method of Phosphor Dispersion Liquid]

The phosphor dispersion liquid of the present invention may be produced by adding to a dispersion solvent phosphor particles, laminar clay mineral microparticles, oxide microparticles, and where necessary, optional additional additives to produce a mixture, and stirring the mixture.

The order in which the respective components are added is not particularly limited. Exemplary modes of addition when using water as part of the dispersion solvent are as follows: 1) laminar clay mineral microparticles (surface-treated to confer lipophilicity) are pre-mixed with a dispersion solvent other than water, and phosphor particles, oxide microparticles, additional additives, and water are added and stirred; and 2) laminar clay mineral microparticles (surface-treated to confer lipophilicity) are pre-mixed with water, and phosphor particles, oxide microparticles, additional additives, and a dispersion solvent other than water are added and stirred. In this manner, the laminar clay mineral microparticles are uniformly dispersed in the phosphor dispersion liquid so that viscosity of the phosphor dispersion liquid can be further increased.

Stirring of the mixture can be carried out using for example a stirrer mill, a blade kneader, or a thin-film spin dispersing machine. By adjusting the stirring conditions, settling of the phosphor particles in the phosphor dispersion liquid can be limited.

[Stirring Device]

Any of the stirring devices known in the art can be employed for stirring of the mixture. Examples include media-less stirring devices such as ULTRA-TURRAX (IKA Co., Ltd), T.K. Auto Homomixer (Primix Co., Ltd.), T.K. Pipeline Homomixer (Primix Co., Ltd.), T.K. Fill Mix (Primix Co., Ltd.), Cleamix (M Technique Co., Ltd.), Clea SS5 (M Technique Co., Ltd.), Cavitron (Eurotech Co., Ltd.), and Fine Flow Mill (Taiheiyo Kiko K.K.); media stirring devices such as Viscomill (Imex Co., Ltd.), Apex Mill (Kotobuki Industries Co., Ltd.), Star Mill (Ashizawa Fine Tech Co., Ltd.), DCP Super Flow (Nippon Eirich K.K.), MP Mill (Inoue, Ltd.), Spike Mill (Inoue, Ltd.), Mighty Mill (Inoue, Ltd.), and SC mill (Mitsui Kozan K.K.); and high-pressure atomizers such as Ultimizer (Sugino Machine K.K.), Nanomizer (Yoshida Kogyosha Co., Ltd.), and NANO3000 (Beryu Co., Ltd.).

[Use of Phosphor Dispersion Liquid]

The phosphor dispersion liquid of the present invention may be used for the formation of a phosphor layer in an LED device (later described). In particular, the phosphor dispersion liquid of the present invention is preferably combined with a binder solution for application on an LED chip to form a phosphor layer. The binder to be combined may be organic resin or may be transparent ceramic.

2. LED Device

[LED Device]

An LED device includes a package, an LED chip, and a phosphor layer that covers the emission surface of the LED chip. FIG. 1 is a cross-sectional view illustrating an example of LED device 100. The LED device includes package 1 having cavity 11, metal part (metal interconnection) 2, LED chip 3 disposed in cavity 11 of package 1, and projection electrodes 4 that connect metal part 2 to LED chip 3. The mode of bonding in which metal part 2 and LED chip 3 are connected via projection electrodes 3 in this manner is called flip-chip bonding.

Package 1 is made of liquid crystal polymer or ceramic, for example. The material of package 1 is not particularly limited as long as it has insulating property and heat resistance.

LED chip 3 is a blue LED chip, for example. An exemplary configuration of a blue LED chip is a laminate of n-GaN semiconductor layer (clad layer), InGaN semiconductor layer (emission layer) and p-GaN semiconductor layer (clad layer), grown on sapphire substrate.

LED chip 3 has a surface that measures, for example, 200 to 300 μm by 200 to 300 μm and has a height of, for example, several tens of micrometers.

LED device 100 illustrated in FIG. 1 includes one LED chip 3 disposed in cavity 11 of package 1. A plurality of LED chips 3 may be disposed in cavity 11 of package 1.

LED device 100 further includes phosphor layer 6 that covers the emission surface of LED chip 3. Phosphor layer 6 refers to a layer containing phosphor particles. It suffices for phosphor layer 6 to cover the emission surface of LED chip 3 (typically, top surface of the LED chip); phosphor layer 6 may cover also the lateral surfaces of LED chip 3 as illustrated in FIG. 1. The thickness of phosphor layer 6 is not particularly limited and is preferably 15 to 300 μm.

Phosphor layer 6 emits fluorescence upon receipt of light (excitation light) emitted from LED chip 3. Mixing of excitation light with fluorescence causes the emission of light of desired color from LED device 100. For example, when the color of light from LED chip 3 is blue and the color of fluorescence from phosphor layer 6 is yellow, LED device 100 serves as a white LED device.

It is required that phosphor particles in phosphor layer 6 be uniformly distributed in order to enable the emission of light of desired color from LED device 100. The phosphor dispersion liquid of the present invention may be used for the formation of phosphor layer 6.

Phosphor layer 6 contains phosphor particles, laminar clay mineral particles, oxide microparticles, binder and other optional components.

The amount of the phosphor particles in phosphor layer 6 is preferably 50 to 95 wt %.

The binder may be transparent organic resin such as silicone resin or may be transparent ceramic such as glass. The binder is preferably transparent ceramic from the perspective of increasing heat resistance and/or the like of phosphor layer 6.

The amount of the binder (transparent ceramic) in phosphor layer 6 is preferably 2 to 50 wt %, more preferably 2.5 to 30 wt %. When the amount of the binder (transparent ceramic) in phosphor layer 6 is less than 2 wt %, the strength of phosphor layer 6 after heating and calcination decreases due to too little ceramic as a binder. On the other hand, when the amount of the binder (transparent ceramic) is greater than 50 wt %, the relative amounts of laminar clay mineral microparticles and inorganic microparticles are low. A relative reduction in the amount of inorganic microparticles reduces the strength of phosphor layer 6. A relative reduction in the amount of the laminar clay mineral microparticles in phosphor layer 6 easily reduces the viscosity of the phosphor dispersion liquid because of the reduced amount of the laminar clay mineral microparticles in the phosphor dispersion liquid.

The amount of the laminar silicate mineral in phosphor layer 6 is preferably 0.5 to 20 wt %, more preferably 0.5 to 10 wt %. When the amount of laminar silicate mineral in phosphor layer 6 is less than 0.5 wt %, it results in failure to provide a sufficient effect of increasing the viscosity of the phosphor dispersion liquid. On the other hand, when the amount of the laminar silicate mineral in phosphor layer 6 is greater than 20 wt %, the strength of the ceramic layer decreases.

The amount of the oxide microparticles in phosphor layer 6 is preferably 0.5 to 50 wt %, more preferably 1 to 40 wt %. When the amount of the oxide microparticles in phosphor layer 6 is less than 0.5 wt % or greater than 50 wt %, the strength of phosphor layer 6 does not increase sufficiently.

[Manufacturing Method of LED Device]

The LED device may be manufactured by the process including the steps of: providing an LED chip package having an LED chip mounted on a package; and forming a phosphor layer by applying on the emission surface of the LED chip a "phosphor dispersion liquid" and a "binder solution."

Figure 2:
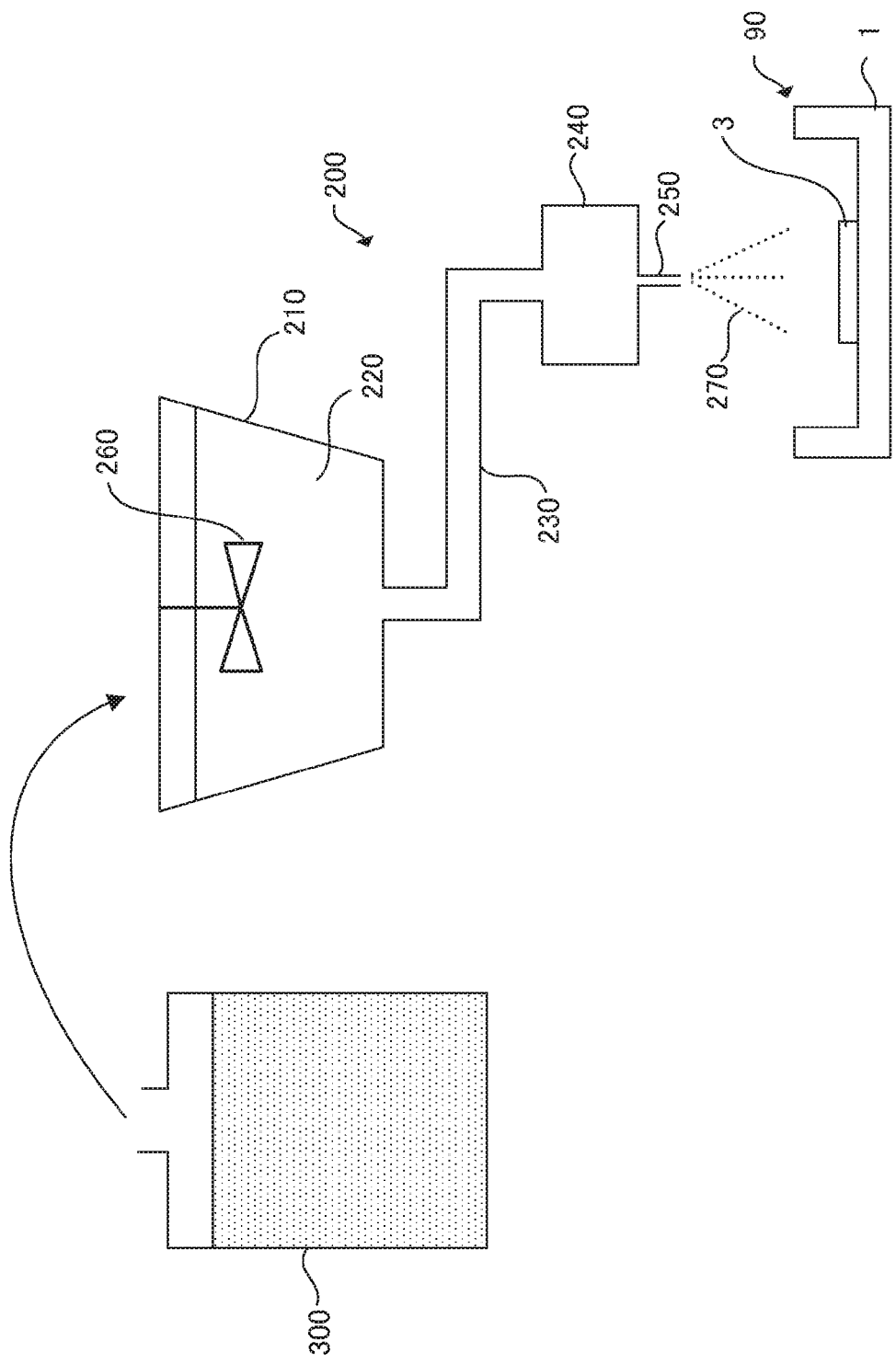
FIG. 2 is a schematic view of an applicator.

LED chip package 90 includes package 1 and LED chip 3 disposed thereon (see FIG. 2). The order in which the phosphor dispersion liquid and binder solution are applied on the emission surface of LED 3 of LED chip package 90 is not particularly limited and may be applied at the same time. Application may be repeated for each of the phosphor dispersion liquid and binder solution.

As the phosphor dispersion liquid to be applied to the LED chip, the phosphor dispersion liquid described above can be employed.

Binder Solution

The binder solution contains a binder or a precursor thereof. As described above, the binder is preferably silicone resin or transparent ceramic. When silicone resin is used as the binder it is preferable to blend the silicone resin in the binder solution. When transparent ceramic is used as the binder it is preferable to blend an organometallic compound, a precursor of transparent ceramic, in the binder solution.

The organometallic compound contained in the binder solution is converted into transparent ceramic (preferably glass ceramic) by the sol-gel reaction. The resultant ceramic binds together the phosphors, laminar silicate minerals and inorganic microparticles to constitute a phosphor layer that encapsulates the LED chip.

Examples of the organometallic compound include metal alkoxides, metal acetylacetonates, and metal carboxylates, with metal alkoxides, which are prone to gelation by hydrolysis and polymerization, being preferable. The type of metal in the organometallic compound is not particularly limited as long as translucent ceramic can be formed. The organometallic compound preferably contains silicon from the perspective of stability and production easiness of glass ceramic to be formed. Different types of organometallic compounds may be combined.

The metal alkoxide may be a single molecule such as tetraethoxysilane or may be a polysiloxane in which organosiloxane moieties are linked either linearly or cyclically; polysiloxanes can increase the viscosity of the binder solution.

Other examples of the organometallic compound include polysilazanes. Polysilazanes may be represented by the general formula $(R_1R_2SiNR_3)n$, where $R_1$, $R_2$ and $R_3$ each independently represent hydrogen, alkyl, aryl, vinyl or cycloalkyl, at least one of $R_1$, $R_2$ and $R_3$ represents hydrogen, preferably all of $R_1$, $R_2$ and $R_3$ represent hydrogen, and n represents an integer of 1 to 60. Polysilazanes may come in any molecular shape and may be for example linear or cyclic.

The binder solution may contain a reaction accelerator in addition to the organometallic compound (especially polysilazane). The reaction accelerator may be acid or base, for example. Specific examples of the reaction accelerator include, but not limited to, bases such as triethylamine, diethylamine, N,N-diethylethanolamine, N,N-dimethylethanolamine, triethanolamine, and triethylamine; hydrochloric acid; oxalic acid; fumaric acid; sulfonic acid; acetic acid; and metal carboxylates containing nickel, iron, palladium, iridium, platinum, titanium, or aluminum. The most preferable are metal carboxylates and are added in preferable amounts of 0.01 to 5 mol % based on polysilazane.

The binder solution may contain a solvent. Examples of the solvent include aliphatic hydrocarbons, aromatic hydrocarbons, halogen hydrocarbons, ethers, and esters. Preferable solvents include methyl ethyl ketone, tetrahydrofuran, benzene, toluene, xylene, dimethyl fluoride, chloroform, carbon tetrachloride, ethyl ether, isopropyl ether, dibutyl ether, and ethylbutyl ether.

The concentration of polysilazane in the binder solution is preferably higher; however, a rise in the polysilazane concentration shortens the storage life of the binder solution. Thus, the polysilazane concentration in the binder solution is preferably 5 to 50 wt % (weight %).

When using a polysilazane solution as the binder solution, the coating formed from the applied binder solution is preferably converted into a ceramic film by heating or irradiation. The heating temperature of the coating is preferably 150 to 500° C., more preferably 150 to 350° C., from the perspective of limiting deterioration of liquid crystal polymers or the like constituting the package of the LED chip. In particular, additional thermal curing after curing by irradiation with UVU radiation containing a wavelength component from 170 to 230 nm (e.g., excimer light) can enhance the effect of moisture permeation prevention.

The phosphor dispersion liquid or binder solution is applied on the LED chip with an applicator to form a phosphor layer. Examples of the applicator include spray applicators and dispenser applicators. These applicators allow for continuous manufacturing of multiple LED devices.

The applicator preferably includes a coating solution tank for storing therein a coating solution (phosphor dispersion liquid or binder solution), a head that include a nozzle through which the coating solution is discharged, and a connector tube that allows for communication between the coating solution tank and the nozzle. FIG. 2 illustrates a schematic of a sprayer for applying a coating solution.

Coating solution 220 in coating solution tank 210 of applicator 200 illustrated in FIG. 2 is pressurized and supplied through connector tube 230 to head 240. Coating solution 220 supplied to head 240 is discharged from nozzle 250 and applied on the coating target (LED chip). For a spray applicator, discharging of the coating solution from nozzle 250 is carried out by means of wind pressure. Nozzle 250 may have an openable and closable port at the tip so that the discharging operation is started or stopped by opening or closing the port.

Applicator 200 preferably includes stirring device 260 inside coating solution tank 210. It suffices for stirring device 260 to be, for example, an impeller-shaped movable piece disposed inside the coating solution tank and configured to be driven by magnetic or electrical force; the configuration of stirring device 260 is not particularly limited. Stirring device 260 stirs the coating solution in coating solution tank 210 and thereby disperses the solute or dispersoid in the coating solution. With such an applicator, discharge liquid 270, a uniform coating solution, can be discharged from nozzle 250.

However, in the case of a phosphor dispersion liquid (coating solution 220) stored for a long time in storage container 300, which stores therein a coating solution to be charged into coating solution tank 210, there are cases wherein phosphors settle down and stick to the inner wall of storage container 300. When such a phosphor dispersion liquid is charged into coating solution tank 210, it requires long time to uniformly disperse the phosphors even when the liquid is stirred by stirring device 260 in coating solution tank 210 thus resulting in reduced application efficiency.

A slight variation in the phosphor concentration in coating solution 220 to be charged into coating solution tank 210 causes a variation in the phosphor concentration in the phosphor dispersion liquid to be applied. Also in the phosphor dispersion liquid remaining in connector tube 230, phosphors may settle down and stick to the wall of connector tube 230. A variation in the phosphor concentration of the phosphor dispersion liquid to be applied also occurs in this case.

In the phosphor dispersion liquid of the present invention, by contrast, phosphor particles do not easily settle down and are easily kept dispersed uniformly. Thus, even when stored for a long time in storage container 300, the phosphor particles in the phosphor dispersion liquid of the present invention are kept dispersed uniformly. For this reason, the phosphor dispersion liquid of the present invention may be supplied to head 240 and discharged from nozzle 250 immediately after it is charged into coating solution tank 210. Moreover, the phosphor concentration in the phosphor dispersion liquid becomes constant and therefore the phosphor concentration in the phosphor layer becomes uniform.

Phosphor layer 6 is formed in the manner described above to produce LED device 100 illustrated in FIG. 1. Additional optical components (e.g., lens) are provided in LED device 100 so that LED device 100 is used as various types of optical part.

EXAMPLES

The present invention will now be described in more detail with reference to Examples and Comparative Examples, which however shall not be construed as limiting the scope of the present invention.

(1) Production of Phosphor Particles

Yellow phosphor particles were produced in the procedure described below. Phosphor raw material having the following composition was fully mixed and loaded into an aluminum crucible followed by the addition of an appropriate amount of fluoride such as ammonium fluoride as flux. The loaded materials were calcined for 2 to 5 hours at 1,350 to 1,450° C. in reducing atmosphere under hydrogen containing-nitrogen gas flow to afford a calcined product having the composition $((Y_{0.72}Gd_{0.24})_3Al_5O_{12}:Ce_{0.04})$.

[Raw Material Composition]

$Y_2O_3$ ... 7.41 g
$Gd_2O_3$ ... 4.01 g
$CeO_2$ ... 0.63 g
$Al_2O_3$ ... 7.77 g

The calcined product was pulverized, washed, separated and dried to afford a desired phosphor. The phosphor was then pulverized to produce phosphor particles of about 10 μm diameter. The phosphor was confirmed to be desired one by analyzing the composition of the phosphor particles. The emission wavelength of the phosphor for 465 nm excitation light had a peak wavelength at roughly 570 nm.

(2) Preparation of Phosphor Dispersion Liquid

The following describes the compositions (weight in grams) of phosphor dispersion liquids prepared in Comparative Examples and Examples.

(2.1) Comparative Example 1

85 g of the phosphor particles prepared above was added to 100 g of propylene glycol and stirred to prepare a phosphor dispersion liquid. Stirring was carried out using T.K. Fill Mix (Primix Co., Ltd.).

(2.2) Comparative Example 2

81 g of the phosphor particles and 4 g of oxide microparticles (RX300, Nippon Aerosil Co., Ltd.; particle size: 7 nm) were added to 100 g of propylene glycol and stirred to prepare a phosphor dispersion liquid. Stirring was carried out as in Comparative Example 1.

(2.3) Example 1

90 g of the phosphor particles, 2.5 g of laminar clay mineral microparticles (Lucentite SWN, CO-OP CHEMICAL Co., Ltd.) and 4 g of oxide microparticles (RX300, Nippon Aerosil Co., Ltd.; particle size: 7 nm) were added in a mixed solvent of propylene glycol (100 g) and isopropyl alcohol (90 g). The mixture was stirred to prepare a phosphor liquid dispersion. Stirring was carried out using T.K. Auto Homomixer (Primix Co., Ltd.).

(2.4) Example 2

90 g of the phosphor particles, 2.5 g of laminar clay mineral microparticles (Micromica MK-100, CO-OP CHEMICAL Co., Ltd.) and 4 g of oxide microparticles (RX300, Nippon Aerosil Co., Ltd.; particle size: 7 nm) were added in a mixed solvent of propylene glycol (100 g) and isopropyl alcohol (70 g). The mixture was stirred to prepare a phosphor liquid dispersion. Stirring was carried out as in Comparative Example 1.

(2.5) Example 3

100 g of the phosphor particles, 2.5 g of laminar clay mineral microparticles (Micromica MK-100, CO-OP CHEMICAL Co., Ltd.) and 4 g of oxide microparticles (Sylysia 470, Fuji Silysia Chemical Ltd.) were added to a mixed solvent of 1,3-butanediol (100 g) and isopropyl alcohol (70 g). The mixture was stirred to prepare a phosphor liquid dispersion. Stirring was carried out using Apex Mill (Kotobuki Industries Co., Ltd.).

(2.6) Example 4

100 g of the phosphor particles, 5 g of laminar clay mineral microparticles (Lucentite SWN, CO-OP CHEMICAL Co., Ltd.) and 6.5 g of oxide microparticles (Sylysia 470, Fuji Silysia Chemical Ltd.) were added to a mixed solvent of 1,3-butanediol (100 g) and isopropyl alcohol (40 g). The mixture was stirred to prepare a phosphor liquid dispersion. Stirring was carried out as in Example 3.

(2.7) Example 5

100 g of the phosphor particles, 2.5 g of laminar clay mineral microparticles (Lucentite SWN, CO-OP CHEMICAL Co., Ltd.) and 6.5 g of oxide microparticles (RX300, Nippon Aerosil Co., Ltd.; particle size: 7 nm) were added to a mixed solvent of 1,3-butanediol (100 g) and isopropyl alcohol (80 g), and the mixture was stirred to prepare a phosphor dispersion liquid. Stirring was carried out as in Example 1.

(2.8) Example 6

100 g of the phosphor particles, 2.5 g of laminar clay mineral microparticles (Lucentite SWN, CO-OP CHEMICAL Co., Ltd.) and 6.5 g of oxide microparticles (RX300, Nippon Aerosil Co., Ltd.; particle size: 7 nm) were added to a mixed solvent of 1,3-butanediol (100 g) and isopropyl alcohol (70 g). The mixture was stirred to prepare a phosphor dispersion liquid. Stirring was carried out as in Comparative Example 1.

(2.9) Example 7

100 g of the phosphor particles, 5 g of laminar clay mineral microparticles (Micromica MK-100, CO-OP CHEMICAL Co., Ltd.) and 6.5 g of oxide microparticles (RX300, Nippon Aerosil Co., Ltd.; particle size: 7 nm) were added to a mixed solvent of 1,3-butanediol (100 g) and isopropyl alcohol (60 g). The mixture was stirred to prepare a phosphor dispersion liquid. Stirring was carried out as in Example 1.

(2.10) Example 8

100 g of the phosphor particles, 5 g of laminar clay mineral microparticles (Lucentite SWN, CO-OP CHEMICAL Co., Ltd.) and 6.5 g of oxide microparticles (Sylysia 470, Fuji Silysia Chemical Ltd.) were added to a mixed solvent of 1,3-butanediol (100 g) and isopropyl alcohol (20 g). The mixture was stirred to prepare a phosphor dispersion liquid. Stirring was carried out as in Example 3.

(2.11) Example 9

100 g of the phosphor particles, 5 g of laminar clay mineral microparticles (Lucentite SWN, CO-OP CHEMICAL Co., Ltd.) and 6.5 g of oxide microparticles (Sylysia 470, Fuji Silysia Chemical Ltd.) were added to a mixed solvent of 1,3-butanediol (100 g) and isopropyl alcohol (60 g). The mixture was stirred to prepare a phosphor dispersion liquid. Stirring was carried out as in Comparative Example 1.

(3) Sample Evaluation (3.1) Measurement of Viscosity

The viscosities of the phosphor dispersion liquids prepared in Comparative Examples 1 and 2 and Examples 1 to 9 were measured with a vibration viscometer (VM-10A-L, CBC Co., Ltd.). The measurements are set forth in Table 1.

(3.2) Measurement of Generation Time of Supernatant Layer due to Settling of Phosphor Particles 5 ml of each of the phosphor dispersion liquids prepared in Comparative Examples 1 and 2 and Examples 1 to 9 was charged into a glass bottle of 15 mm inner diameter and allowed to stand at room temperature. The thickness of a supernatant layer generated due to settling of phosphor particles was measured every hour with a scale. The measurements are set forth in Table 1 along with the compositions of the respective samples.

(3.3) Evaluation of Degree of Sticking to Inner Wall of Storage Container

The phosphor dispersion liquids prepared in Comparative Examples 1 and 2 and Examples 1 to 9 were charged into stainless steel storage containers of 100 mm inner diameter and 150 mm height. The phosphor dispersion liquid was transferred to another container every hour, and the sticking of the phosphors to the inner wall of the storage container was visually evaluated based on the criteria described below. The evaluations are set forth in Table 2.
  A: No sticking occurred
  B: Sticking occurred; stuck matter disappeared after the storage container was shaken several times and the phosphor dispersion liquid was transferred to another container
  C: Sticking occurred; part of stuck matter did not disappear even after the storage container was shaken several times and the phosphor dispersion liquid was transferred to another container
  D: Sticking occurred; stuck matter did not disappear at all even after the storage container was shaken several times and the phosphor dispersion liquid was transferred to another container, as with a case where the phosphor dispersion liquid was transferred to another container without shaking the storage container (3.4) Measurement of Dispersing Time Inside Applicator The phosphor dispersion liquid was supplied to a coating solution tank equipped with a stirring device in the applicator, stirred, and applied every 5 minutes. Chromaticity was measured for 5 selected coating samples. Chromaticity measurements were done using spectroradiometer CS-1000A (Konica Minolta Sensing, Inc.) A standard deviation of the measurements for the 5 samples was calculated to evaluate uniformity of chromaticity. Phosphor dispersion liquids that exhibited a standard deviation of 0.02 or less were evaluated as being phosphor dispersion liquids in which phosphor particles are sufficiently dispersed.

TABLE 1

| | Composition (g) | | | | | | | | | Thickness of supernatant layer measured at | | | |
|---|---|---|---|---|---|---|---|---|---|---|---|---|---|
| | Dispersion solvent | | | Laminar clay mineral | | Oxide microparticles | | | | intervals of 1 hour (mm) | | | |
| | Propylene glycol | 1,3-butanediol | Isopropyl alcohol | Lucentite SWN | Micromica MK-100 | RX300 | 470 | Phosphor | Viscosity (cp) | 1 h | 2 h | 3 h | 4 h |
| Comp. Ex. 1 | 100 | | | | | | | 85 | 50 | 0 | 1 | 2 | 3 |
| Comp. Ex. 2 | 100 | | | | | 4 | | 81 | 150 | 0 | 0 | 1 | 2 |
| Ex. 1 | 100 | | 90 | 2.5 | | 4 | | 90 | 80 | 0 | 0 | 0 | 0 |
| Ex. 2 | 100 | | 70 | | 2.5 | 4 | | 90 | 250 | 0 | 0 | 0 | 0 |
| Ex. 3 | | 100 | 70 | | 2.5 | | 4 | 100 | 350 | 0 | 0 | 0 | 0 |
| Ex. 4 | | 100 | 40 | 5 | | | 6.5 | 100 | 640 | 0 | 0 | 0 | 0 |
| Ex. 5 | | 100 | 80 | 2.5 | | 6.5 | | 100 | 200 | 0 | 0 | 0 | 0 |
| Ex. 6 | | 100 | 70 | 2.5 | | 6.5 | | 100 | 320 | 0 | 0 | 0 | 0 |
| Ex. 7 | | 100 | 60 | | 5 | 6.5 | | 100 | 360 | 0 | 0 | 0 | 0 |
| Ex. 8 | | 100 | 20 | 5 | | | 6.5 | 100 | 850 | 0 | 0 | 0 | 0 |
| Ex. 9 | | 100 | 60 | 5 | | | 6.5 | 100 | 450 | 0 | 0 | 0 | 0 |

TABLE 2

| | Degree of sticking to inner wall of storage container (visual inspection) | | | | Dispersion time in coating solution tank |
|---|---|---|---|---|---|
| | 1 h | 2 h | 3 h | 4 h | Min |
| Comp. Ex. 1 | A | A | A | A | 90 |
| Comp. Ex. 2 | A | A | A | A | 60 |
| Ex. 1 | A | A | A | A | 15 |
| Ex. 2 | A | A | A | A | 15 |
| Ex. 3 | A | A | A | B | 25 |
| Ex. 4 | A | A | B | C | 35 |
| Ex. 5 | A | A | A | A | 15 |
| Ex. 6 | A | A | A | A | 20 |
| Ex. 7 | A | A | A | B | 25 |
| Ex. 8 | A | B | B | C | 40 |
| Ex. 9 | A | A | B | B | 30 |

The phosphor dispersion liquids prepared in Comparative Examples 1 and 2 showed settling of phosphor particles within 3 hours. By contrast, settling of phosphor particles within 4 hours was not observed for the phosphor dispersion liquids prepared in Examples 1 to 9.

Further, the phosphor dispersion liquids prepared in Examples 1, 2, 5 and 6 showed no phosphors stuck to the inner wall of the storage container.

INDUSTRIAL APPLICABILITY

The phosphor dispersion liquid of the present invention is suitably used as a source liquid of a phosphor layer of an LED device. The phosphor dispersion liquid effectively limits a variation in luminescence chromaticity and the like in an LED device.

REFERENCE SIGNS LIST

1 Package
2 Metal Part
3 LED Chip
4 Projection Electrode
6 Phosphor Layer
90 LED Chip Package
100 LED Device
200 Applicator
210 Coating Solution Tank
220 Coating Liquid
230 Connector Tube
240 Head
250 Nozzle
260 Stirring Device
270 Discharge Liquid
300 Storage Container

The invention claimed is:

1. A phosphor dispersion liquid comprising a dispersion solvent, phosphor particles, laminar clay mineral microparticles, and oxide microparticles, the phosphor particles, the laminar clay mineral microparticles, and the oxide microparticles being dispersed in the dispersion solvent, wherein the laminar clay mineral microparticles have a plate shape, and when 5 ml of the phosphor dispersion liquid is charged into a glass bottle of 15 mm inner diameter and allowed to stand, the time it takes for a supernatant layer to be generated due to settling of the phosphor particles is 4 hours or longer.

2. The phosphor dispersion liquid according to claim 1, wherein the phosphor dispersion liquid has a viscosity of 80 to 1,000 cp.

3. A method of manufacturing an LED device, comprising:
providing an LED chip package including a package and an LED chip disposed on the package, the LED chip having an emission surface; and
applying on the emission surface of the LED chip the phosphor dispersion liquid according to claim 1 to form a phosphor layer.

4. The method according to claim 3, wherein the phosphor dispersion liquid is applied using a spray applicator, the spray applicator including a coating solution tank for storing the phosphor dispersion liquid, a head having a nozzle for discharging the phosphor dispersion liquid, and a connector tube for allowing communication between the coating solution tank and the head.

5. The method according to claim 3, further comprising applying on the emission surface of the LED chip a solution containing an organometallic compound.

6. The method according to claim 3, wherein the LED device is a white LED device.

* * * * *